(12) United States Patent
Zaczek et al.

(10) Patent No.: US 9,684,252 B2
(45) Date of Patent: **\*Jun. 20, 2017**

(54) OPTICAL ELEMENT WITH AN ANTIREFLECTION COATING, PROJECTION OBJECTIVE, AND EXPOSURE APPARATUS COMPRISING SUCH AN ELEMENT

(75) Inventors: Christoph Zaczek, Heubach (DE); Alexandra Pazidis, Aalen (DE)

(73) Assignee: Carl Zeiss SMT GmbH, Oberkochen (DE)

( \* ) Notice: Subject to any disclaimer, the term of this patent is extended or adjusted under 35 U.S.C. 154(b) by 738 days.

This patent is subject to a terminal disclaimer.

(21) Appl. No.: 13/281,138

(22) Filed: Oct. 25, 2011

(65) Prior Publication Data

US 2012/0038897 A1    Feb. 16, 2012

Related U.S. Application Data

(63) Continuation of application No. 11/917,500, filed as application No. PCT/EP2006/005630 on Jun. 13, 2006, now Pat. No. 8,049,964.

(Continued)

(51) Int. Cl.
*G03F 7/20* (2006.01)
*G02B 1/113* (2015.01)
(Continued)

(52) U.S. Cl.
CPC ........... *G03F 7/70958* (2013.01); *G02B 1/02* (2013.01); *G02B 1/113* (2013.01); *G02B 1/115* (2013.01);
(Continued)

(58) Field of Classification Search
CPC .. G02B 1/10; G02B 1/11; G02B 1/113; G02B 1/115; G02B 5/20; G02B 5/28;
(Continued)

(56) References Cited

U.S. PATENT DOCUMENTS 3,799,653 A    3/1974  Ikeda
5,532,871 A  \* 7/1996  Hashimoto et al. .......... 359/359
(Continued)

FOREIGN PATENT DOCUMENTS

DE   196 33 128 A1   2/1998
GB       538 272 A    7/1941

OTHER PUBLICATIONS

Macleod, "Thin-Film Optical Filters", Institute of Physics Publishing, Bristol, 2001, pp. 87-88.
(Continued)

*Primary Examiner* — Kimberly N Kakalec
(74) *Attorney, Agent, or Firm* — Edell, Shapiro & Finnan, LLP

(57) ABSTRACT

An optical element (14) transparent for radiation with a wavelength λ in the ultraviolet wavelength range below 250 nm, in particular at 193 nm, comprises a substrate (17) with a refractive index $n_s$ larger than 1.6, and an antireflection coating (16) formed on at least part of the surface of the substrate (17) between the substrate (17) and an ambient medium with a refractive index $n_A$, preferably with $n_A=1.0$. The antireflection coating (16) consists of a single layer of a material with a refractive index $n_L$ of about $n_L=\sqrt{n_A n_S}$, in particular $n_L>1.3$, and the optical thickness $d_L$ of the single layer is about λ/4. The optical element (14) is preferably part of a projection objective (5) in a microlithography projection exposure apparatus (1) and located adjacent to a light-sensitive substrate (10).

13 Claims, 4 Drawing Sheets

Related U.S. Application Data

Figure 1:
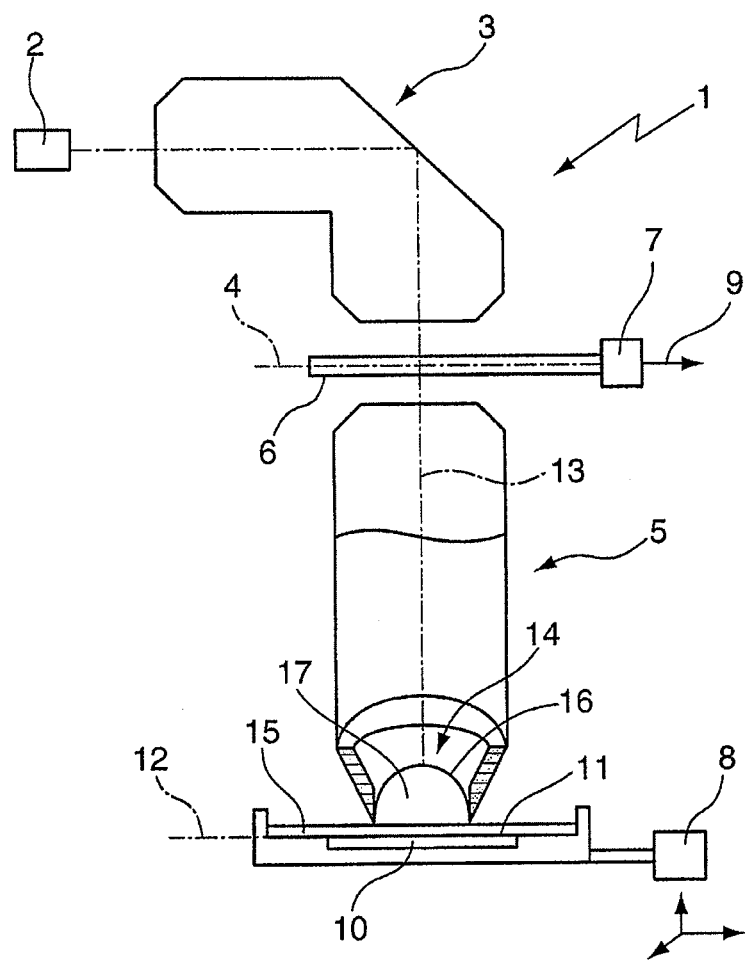

(60) Provisional application No. 60/690,539, filed on Jun. 14, 2005.

(51) Int. Cl.
  *G02B 1/115* (2015.01)
  *G02B 1/02* (2006.01)

(52) U.S. Cl.
  CPC ...... *G03F 7/70341* (2013.01); *G03F 7/70941* (2013.01)

(58) Field of Classification Search
  CPC ........ G02B 5/283; G02B 5/285; G02B 5/286; G02B 27/0018
  USPC ........ 359/350, 359, 577, 580–581, 586–589, 359/601; 355/53
  See application file for complete search history.

(56) References Cited

U.S. PATENT DOCUMENTS

| | | | |
|---|---|---|---|
| 6,064,516 A | | 5/2000 | Schuster |
| 6,243,203 B1* | | 6/2001 | Schleipen et al. ............ 359/581 |
| 6,574,039 B1* | | 6/2003 | Murata et al. ................ 359/359 |
| 6,590,702 B1* | | 7/2003 | Shirai ........................... 359/359 |
| 2002/0191168 A1* | | 12/2002 | Ishizawa ............... C03C 17/007 355/53 |
| 2003/0218798 A1* | | 11/2003 | Kanazawa ............. G02B 1/115 359/359 |
| 2006/0164616 A1 | | 7/2006 | Okada |
| 2006/0256306 A1 | | 11/2006 | Lin et al. |

OTHER PUBLICATIONS

Heber et al., "Changes in optical interference coatings exposed to 193nm excimer laser radiation", Proceedings of the SPIE—The International Society for Optical Engineering, vol. 3578, 1999, pp. 83-96.

Burnett et al., "High-index materials for 193nm immersion lithography", Proceedings of the SPIE—The International Society for Optical Engineering, vol. 5754, No. 1, Mar. 1, 2005, pp. 611-621.

Burnett et al., "High index materials for 193nm and 157nm immersion lithography", International Symposium on Immersion & 157nm Lithography, Feb. 8, 2004, Alkaline Earth Oxides.

Naumann, "Bauelemente der Optik, passage", Bauelemente der Optik. Taschenbuch der Technischen Optik, Carl Hanser Verlag; Munich, Germany; 1992, pp. 62-67.

Niisaka et al., "Development of Optical Coatings for 157-nm Lithography. I. Coating Materials", Applied Optics Optical Society of America USA, vol. 41, No. 16, Jun. 1, 2002, pp. 3242-3247.

* cited by examiner

OPTICAL ELEMENT WITH AN ANTIREFLECTION COATING, PROJECTION OBJECTIVE, AND EXPOSURE APPARATUS COMPRISING SUCH AN ELEMENT

This application is a Continuation of U.S. application Ser. No. 11/917,500, filed on Apr. 16, 2008, now U.S. Pat. No. 8,049,964 which is the National Stage of International Application No. PCT/EP06/05630, filed Jun. 13, 2006, which claims the benefit under 35 U.S.C. 119(e)(1) of U.S. Provisional Application No. 60/690,539, filed Jun. 14, 2005. The disclosures of each of these earlier U.S. and International applications are incorporated by reference in their respective entireties into the disclosure of this Continuation application.

FIELD OF THE INVENTION

The present invention relates to an optical element transparent for radiation with a wavelength $\lambda$ in the ultraviolet wavelength range below 250 nm, in particular at 193 nm, comprising a substrate with a refractive index $n_s$ larger than 1.6, preferably larger than 1.7, more preferably larger than 1.8, and an antireflection coating formed on at least part of the surface of the substrate between the substrate and an ambient medium with a refractive index $n_A$ preferably with $n_A=1.0$, as well as to a projection objective and an exposure apparatus with at least one such optical element.

BACKGROUND OF THE INVENTION

Optical elements being transparent for radiation provided by a laser beam with a wavelength below 250 nm, in particular with 248 nm or 193 nm, are used e.g. in microlithography projection exposure apparatuses for producing semiconductor elements. Such apparatuses generally comprise an illumination system for homogeneously illuminating a reticle mask and a projection objective for imaging a structure on the reticle mask onto a light-sensitive substrate. In a technique commonly referred to as immersion lithography, an immersion liquid is disposed between a terminating element, i.e. an optical element of the projection objective which is located adjacent to the light-sensitive substrate, and the resist (light-sensitive substrate) in order to increase the numerical aperture (NA) of the projection objective, thus allowing radiation with higher angles of incidence to reach the substrate.

The refractive index of the immersion liquid should ideally match the refractive index of the resist, being in a range of about 1.6 to 1.7. The refractive index of the optical element which is located adjacent to the light-sensitive substrate should have a comparable value and should in particular be as high as possible when an immersion fluid with a refractive index smaller than the refractive index of the resist is used. Recently, several high refractive index materials suitable for such an application have been identified.

The portion of radiation reflected by transparent optical elements, in particular high refractive index elements ($n_S>1.6$ for a wavelength of 193 nm) should be made as small as possible over a wide range of incident angles in order to have as high a transmittance as possible. For this purpose, it is known in the art to form antireflection coatings on the surface of the substrate materials of those optical elements at least in those areas exposed to radiation.

A known type of antireflection coating for such optical elements with a high refractive index substrate consists of an arrangement having a plurality of alternating high refractive index layers and low refractive index layers.

OBJECT OF THE INVENTION

It is the object of the invention to provide an optical element as described above with a durable antireflection coating showing low reflectance to incident radiation preferably over a wide range of incident angles.

SUMMARY OF THE INVENTION

According to a first aspect of the invention, this object is attained by an optical element as described above having an antireflection coating comprising a single layer of a material having a refractive index $n_L$ of about $n_L=\sqrt{n_A n_S}$, in particular $n_L>1.3$, and wherein the optical thickness $d_L$ of the single layer is about $\lambda/4$.

In the following, an ambient medium with a refractive index $n_A=1.0$, such as air, is considered, such that the formula for the refractive index of the single layer is simplified to $$n_L=\sqrt{n_S} \qquad [1].$$

It is known that for minimizing reflectance of an optical element having only a single antireflection layer, a wave reflected at the interface between the ambient medium and the single layer and a wave reflected at the surface of the substrate should have a phase shift of $\pi$ and that their respective amplitudes should be identical.

The first requirement concerning phase is met by choosing the optical thickness $d_L$ of the single layer to be $\lambda/4$ (or an integer multiple thereof), the optical thickness (in units of wavelength $\lambda$) being related to the physical thickness $d_P$ of the layer (for an angle of incidence of 0°) by $d_L=(n_L d_P)/\lambda$. The specifications of the layer thicknesses described in the present application may vary in a range of +/−25%, preferably −15% to +30%, owing to the fact that the layer thickness is in not constant over the surface of the substrate, but varies in dependence of the incident angle of the incident radiation which increases from the center to the outer regions of the surface. Consequently, a layer thickness somewhat larger, e.g. approx. 5%, than the theoretical value of $\lambda/4$ may be chosen in practice in order to have low reflectance also for radiation of larger angles of incidence.

The second requirement regarding amplitude is not so easily met, since the choice of materials transparent for UV radiation satisfying the formula $n_L=\sqrt{n_S}$ is limited. Sometimes, the material which satisfies this condition best has to be substituted by another material having better mechanical properties, e.g. showing less stress.

Although for wavelengths in the visible domain of about 550 nm, antireflection coatings with a single layer material such as magnesium fluoride ($MgF_2$) can satisfy the above requirements, for radiation with UV wavelengths no layer material with a refractive index below 1.3 which is sufficiently stable to laser radiation is known. Although by applying porous $MgF_2$ to a substrate, a material with a refractive index of 1.3 for a wavelength of 193 nm could be formed, such a material would be mechanically instable and susceptible to contamination. Other materials having a low refractive index such as polymers are in general also unstable to laser radiation in the UV wavelength range.

The invention makes use of the fact that for high index substrates with a refractive index larger than 1.6, layer materials satisfying the formula [1] and showing sufficient durability for laser radiation with a wavelength of 193 nm can be found.

Thus, still according to the first aspect of the invention, the object is attained by an optical element transparent for radiation with a wavelength λ in the ultraviolet wavelength range below 250 nm, in particular at 193 nm, comprising: a substrate of a material which is selected from the group consisting of: crystalline silicon oxide ($SiO_2$), potassium chloride (KCl), sodium chloride (NaCl), spinel ($MgAl_2O_4$), sapphire ($Al_2O_3$), magnesium oxide (MgO), yttrium aluminium garnet ($Y_3Al_5O_{12}$), scandium aluminium garnet ($Sc_3Al_5O_{12}$), germanium oxide ($GeO_2$), lutetium aluminium garnet ($Lu_3Al_5O_{12}$), calcium oxide (CaO), and mixtures thereof, and an antireflection coating formed on at least part of the surface of the substrate, wherein the antireflection coating comprises a single layer of a material selected from the group consisting of: chiolithe ($Na_5Al_3F_{14}$), cryolite ($Na_3AlF_6$), aluminium fluoride ($AlF_3$), magnesium fluoride ($MgF_2$), silicon oxide ($SiO_2$), gadolinium fluoride ($GdF_3$), lanthanum fluoride ($LaF_3$), erbium fluoride ($ErF_3$), calcium fluoride ($CaF_2$), yttrium fluoride ($YF_3$), neodymium fluoride ($NdF_3$), dysprosium fluoride ($DyF_3$), holmium fluoride ($HoF_3$), scandium fluoride ($ScF_3$), zirconium fluoride ($ZrF_4$), ytterbium fluoride ($YbF_3$), strontium fluoride ($SrF_2$), hafnium fluoride ($HfF_4$), lithium fluoride (LiF), sodium fluoride (NaF), thorium fluoride ($ThF_3$), and mixtures thereof.

In preferred embodiments, specific high refractive index substrate materials are advantageously combined with such suitable single layer materials. These combinations are summarized in the following table:

TABLE 1

| substrate | refractive index of the substrate ($n_s$) | refractive index of the ideal layer ($n_{LJd} = \sqrt{n_s}$) | single layer material | refractive index of the single layer material ($n_L$) |
|---|---|---|---|---|
| $BaF_2$ | 1.57 | 1.25 | | |
| crystalline $SiO_2$ | 1.66 | 1.29 | | |
| KCl | 1.76 | 1.33 | $Na_5Al_3F_{14}$/$Na_3AlF_6$ | 1.35 |
| NaCl | 1.83 | 1.35 | $Na_5Al_3F_{14}$/$Na_3AlF_6$ | 1.35 |
| spinel | 1.87 | 1.37 | $AlF_3$ | 1.41 |
| sapphire | 1.93 | 1.39 | $AlF_3$ | 1.41 |
| MgO | 2 | 1.41 | $AlF_3$ | 1.41 |
| $Y_3Al_5O_{12}$ | 2 | 1.41 | $AlF_3$ | 1.41 |
| $GeO_2$ | 2.05 | 1.43 | $MgF_2$ | 1.44 |
| $Sc_3Al_5O_{12}$ | 2.1 | 1.45 | $MgF_2$ | 1.44 |
| $Lu_3Al_5O_{12}$ | 2.14 | 1.46 | $MgF_2$ | 1.44 |
| CaO | 2.7 | 1.64 | $GdF_3$/$ErF_3$ | 1.65 |

Suitable substrate and layer materials are not limited to those described in table 1. It is, for example, also possible to use other materials as a substrate, such as polycrystalline materials, e.g. ceramic spinel which has physical properties similar to those of crystalline spinel, except that it has no systematic intrinsic birefringence. Also, composite substrate materials may be used, e.g. by combining MgO with sapphire ($Al_2O_3$) forming a material of the spinel type: MgO×m $Al_2O_3$, m having preferably a value between 0.9 and 4, in particular m=1.

Further suitable substrate materials with a refractive index at or above 2.0 are garnets, as they also exhibit a small intrinsic birefringence at a wavelength of 193 nm. Garnets (of the 3-3 type) are commonly described by the chemical formula $(M1)_3(M2)_5O_{12}$, where M1 is a metal chosen from the group consisting of yttrium, lanthanum, gadolinium, terbium, erbium, scandium, and lutetium, and M2 is a metal chosen from the group consisting of aluminium, gallium, indium, and thallium. Yttrium aluminium garnet ($Y_3Al_5O_{12}$), also referred to as YAG, is a material of this group with a high optical quality and small intrinsic birefringence, yet does not show high transmission at 193 nm. Still, its transmission may be improved by partially substituting yttrium with scandium or lanthanum. In particular, an alloy of yttrium and scandium seems to be well-suited for this purpose. Also, lutetium aluminium garnet ($Lu_3Al_5O_{12}$) has a good optical properties, in particular low intrinsic birefringence and high transmission. Garnets of a different type, especially those of the 2-3-4 type such as germanate garnets, also have optical properties which make them suitable for lithography at 193 nm.

Regarding the high-index substrate materials with a comparatively low refractive index, e.g. $BaF_2$ and $SiO_2$, it is evident from table 1 that no ideally suited layer material is known. For $BaF_2$, the antireflection coatings of amorphous $SiO_2$ (refractive index=1.56) which are well-known in the art may be applied. For crystalline $SiO_2$, chiolithe or cryolite may be used which have a refractive index of 1.35 which comes closest to the ideal refractive index $n_{LJd}$=1.29.

A second aspect of the invention is realized in an optical element of the type described above having an antireflection coating which comprises a first layer with refractive index $n_{L1}$ adjacent to the substrate and a second layer with refractive index $n_{L2}$ superimposed over the first layer ($n_{L2}>n_{L1}$), the refractive indices of both layers being approximately related by $n_{L1}=\sqrt{n_A n_S}$ and both layers having an optical thickness of about λ/4.

An antireflective coating consisting of two layers satisfying the above requirements can be preferably used e.g. to reduce reflectance for large angles of incidence (>40°) or when a substrate material is used for which no single layer material satisfying the formula [1] is known, as is the case for crystalline $SiO_2$. In this case, an antireflection coating is preferred in which the first layer material is lanthanum fluoride ($LaF_3$) and the second layer material is cryolite ($Na_3AlF_6$) or chiolithe ($Na_5Al_3F_{14}$).

A third aspect of the invention is realized in an optical element as described above having an antireflection coating which consists of at least three layers with refractive indices $n_{Li}$, the refractive indices $n_{Li}$ of the layers decreasing ($n_{L1}>n_{L2}>n_{L3}$ . . . ) with increasing distance from the substrate.

With the antireflective coating as described above, a continuous transition of the refractive index from the substrate to the ambient medium (ideal antireflection coating) is approximated. Due to the lack of a durable layer material with a refractive index smaller than 1.3, a first approximation is that the refractive index of the layer adjacent to the ambient medium (ideally: 1.0) is at least 1.3. A second approximation is that discrete steps of the refractive index are generated by the superposition of layers with different indices of refraction. However, such an antireflective coating is preferred over a coating having a continuous change in the refractive index (gradient layer), as the production process of such a layer, e.g. simultaneous vaporization, is technologically involved and expensive.

Therefore, according to the third aspect, the invention is also realized in an optical element transparent for radiation with a wavelength λ in the ultraviolet wavelength range below 250 nm, in particular at 193 nm, comprising: a substrate of a material selected from the group consisting of magnesium oxide (MgO) or yttrium aluminium garnet ($Y_3Al_5O_{12}$), and an antireflection coating formed on at least part of the surface of the substrate which comprises at least three layers, the material of a first layer adjacent to the substrate being sapphire ($Al_2O_3$) or spinel ($MgAl_2O_4$), the material of a second layer superimposed over the first layer being lanthanum fluoride ($LaF_3$), and the material of a third layer superimposed over the second layer being chiolithe ($Na_5Al_3F_{14}$) or cryolite ($Na_3AlF_6$). The refractive index of magnesium oxide and yttrium aluminium garnet for a wavelength of 193 nm is $n_s=2.0$. The respective refractive indices of the layer materials are: $n_{L1}(Al_2O_3)=1.87$, $n_{L1}(MgAl_2O_4)=1.93$, $n_{L2}(LaF_3)=1.7$, and $n_{L3}(Na_5Al_3F_{14})=n_{L3}(Na_3AlF_6)=1.35$, such that an ideal antireflection coating can be approximated sufficiently well.

It is preferred that the overall optical thickness of the antireflection coating is between 0.6 and 3 (in units of wavelength $\lambda$). The overall thickness should not exceed 5 in order to avoid the occurrence of stress in the layer materials.

According to a fourth aspect of the invention, the invention is realized in an optical element of the type described above wherein the antireflection coating consists of high or medium refractive index layers alternating with low refractive index layers, and the optical thicknesses of all high or medium and low refractive index layers are chosen such that reflection of radiation, in particular for high angles of incidence, is minimized. The optical thicknesses of the layers satisfying this requirement can be calculated for the specific substrates by computer simulations, the results of which can be tested by fabricating the antireflection coatings with the calculated layer thicknesses, and checking their optical properties for subsequent optimization. Thus, even though a computer program is used, the determination of the optimized layer thicknesses which will be given below is by no means trivial.

Suitable substrate materials for an optical element according to the fourth aspect of the invention are barium fluoride ($BaF_2$), crystalline silicon oxide ($SiO_2$), potassium chloride (KCl), sodium chloride (NaCl), spinel ($MgAl_2O_4$), sapphire ($Al_2O_3$), magnesium oxide (MgO), yttrium aluminium garnet ($Y_3Al_5O_{12}$), scandium aluminium garnet ($Sc_3Al_5O_{12}$), germanium oxide ($GeO_2$), lutetium aluminium garnet ($Lu_3Al_5O_{12}$), calcium oxide (CaO), and mixtures thereof.

In a preferred embodiment, the optical thicknesses of all the high or medium refractive index layers and all the low refractive index layers are different from each other. Antireflection coatings with such a totally aperiodic layer structure are preferred over periodic coatings for the present applications, as they are superior in performance. Totally aperiodic layer structures may also be advantageously used in order to increase the reflectance of reflective optical elements, as is described in U.S. provisional patent application 60/683,691.

It is preferred when the high refractive index layers have a refractive index larger than 1.8, the medium refractive index layers have a refractive index between 1.58 and 1.8, and the low refractive index layers have a refractive index smaller than 1.58. In most cases, medium refractive index layers can be replaced by high index layers with only small adaptations in the coating design, whereas the inverse is impossible in the majority of cases.

Designs of antireflection coatings with optimized layer thicknesses are shown in table 2 below for several substrates, wherein the layer thicknesses are defined in units of the wavelength ($\lambda=193$ nm) and the first layer is formed adjacent to the substrate. It is understood that the optimized values given below may vary depending on their position on the substrate in a range from −15% to +30%. For some substrate materials, a suitable range which is valid for all positions on the substrate is given below.

TABLE 2

|  | design 1 | design 2 | design 3 | design 4 | design 5 | design 6 | design 7 |
|---|---|---|---|---|---|---|---|
| substrate: $SiO_2$ ($n_s = 1.66$) | | | | | | | |
| $1^{st}$ medium refractive index layer | 0.48 | | 0.30 | | | 0.04 | |
| $1^{st}$ low refractive index layer | 0.40 | 0.40 | 0.09 | 0.12 | 0.47 | 0.10 | 0.09 |
| $2^{nd}$ medium refractive index layer | 0.47 | 0.47 | 0.08 | 0.04 | 0.26 | 0.35 | 0.35 |
| $2^{nd}$ low refractive index layer | 0.26 | 0.26 | 0.34 | 0.34 | 0.25 | 0.27 | 0.27 |
| $3^{rd}$ medium refractive index layer | 0.29 | 0.29 | 0.28 | 0.28 | | | |
| $3^{rd}$ low refractive index layer | 0.26 | 0.26 | 0.27 | 0.27 | | | |
| substrate: KCl ($n_s = 1.76$) | | | | | | | |
| $1^{st}$ medium refractive index layer | 0.21 | | 0.04 | | 0.33 | | |
| $1^{st}$ low refractive index layer | 0.41 | 0.43 | 0.10 | 0.10 | 0.09 | 0.07 | |
| $2^{nd}$ medium refractive index layer | 0.46 | 0.45 | 0.07 | 0.07 | 0.37 | 0.38 | |
| $2^{nd}$ low refractive index layer | 0.25 | 0.23 | 0.34 | 0.34 | 0.27 | 0.27 | |
| $3^{rd}$ medium refractive index layer | 0.30 | 0.31 | 0.28 | 0.28 | | | |
| $3^{rd}$ low refractive index layer | 0.25 | 0.25 | 0.27 | 0.27 | | | |
| substrate: NaCl ($n_s = 1.83$) | | | | | | | |
| $1^{st}$ medium refractive index layer | 0.16 | | 0.14 | 0.59 | 0.05 | | 0.23 |
| $1^{st}$ low refractive index layer | 0.39 | 0.46 | 0.61 | 0.07 | 0.07 | 0.08 | 0.43 |
| $2^{nd}$ medium refractive index layer | 0.45 | 0.42 | 0.07 | 0.10 | 0.10 | 0.11 | 0.26 |
| $2^{nd}$ low refractive index layer | 0.25 | 0.22 | 0.36 | 0.32 | 0.33 | 0.33 | 0.25 |
| $3^{rd}$ medium refractive index layer | 0.29 | 0.32 | 0.30 | 0.28 | 0.28 | 0.28 | |
| $3^{rd}$ low refractive index layer | 0.26 | 0.25 | 0.26 | 0.27 | 0.27 | 0.27 | |
| substrate: $Al_2O_3$ ($n_s = 1.93$) or $MgAl_2O_4$ ($n_s = 1.87$) | | | | | | | |
| $1^{st}$ medium refractive index layer | 0.10 to 0.2 | 0.55 to 0.67 | 0.03 to 0.12 | | | 0.17 to 0.27 | 0.24 to 0.34 |
| $1^{st}$ low refractive index layer | | 0.5 to 0.65 | 0.02 to 0.11 | 0.02 to 0.11 | 0.03 to 0.11 | 0.35 to 0.45 | 0.12 to 0.22 |
| $2^{nd}$ medium refractive index layer | 0.03 to 0.12 | 0.08 to 0.16 | 0.09 to 0.18 | 0.09 to 0.18 | 0.23 to 0.32 | 0.29 to 0.4 | |
| $2^{nd}$ low refractive index layer | 0.33 to 0.42 | 0.27 to 0.36 | 0.27 to 0.37 | 0.27 to 0.38 | 0.22 to 0.32 | 0.22 to 0.32 | |
| $3^{rd}$ medium refractive index layer | 0.26 to 0.35 | 0.23 to 0.33 | 0.23 to 0.33 | 0.23 to 0.33 | | | |
| $3^{rd}$ low refractive index layer | 0.22 to 0.32 | 0.22 to 0.32 | 0.22 to 0.32 | 0.22 to 0.32 | | | |

TABLE 2-continued

| | design 1 | design 2 | design 3 | design 4 | design 5 | design 6 | design 7 |
|---|---|---|---|---|---|---|---|
| substrate: MgO ($n_s = 2.0$) or $Y_3Al_5O_{12}$ ($n_s = 2.0$) | | | | | | | |
| $1^{st}$ medium refractive index layer | 0.18 | 0.64 | 0.32 | | 0.24 | | |
| $1^{st}$ low refractive index layer | 0.34 | 0.02 | 0.49 | 0.04 | 0.36 | | |
| $2^{nd}$ medium refractive index layer | 0.46 | 0.12 | 0.48 | 0.18 | 0.27 | | |
| $2^{nd}$ low refractive index layer | 0.25 | 0.31 | 0.28 | 0.33 | 0.26 | | |
| $3^{rd}$ medium refractive index layer | 0.28 | 0.29 | 0.29 | 0.28 | | | |
| $3^{rd}$ low refractive index layer | 0.26 | 0.26 | 0.26 | 0.27 | | | |
| substrate: $GeO_2$ ($n_s = 2.05$) cf. MgO | | | | | | | |
| substrate: $Lu_3Al_5O_{12}$ ($n_s = 2.14$) | | | | | | | |
| $1^{st}$ high refractive index layer | 0.45 | 0.4 to 0.5 | 0.45 | 0.4 to 0.5 | 0.2 | 0.15 to 0.25 | |
| $1^{st}$ low refractive index layer | 0.13 | 0.06 to 0.2 | 0.06 | 0.03 to 0.12 | 0.49 | 0.44 to 0.53 | |
| $2^{nd}$ high refractive index layer | 0.10 | 0.04 to 0.15 | 0.14 | 0.1 to 0.2 | 0.36 | 0.32 to 0.41 | |
| $2^{nd}$ low refractive index layer | 0.24 | 0.2 to 0.29 | 0.55 | 0.48 to 0.62 | 0.24 | 0.2 to 0.29 | |
| $3^{rd}$ high refractive index layer | 0.46 | 0.42 to 0.51 | 0.42 | 0.38 to 0.47 | | | |
| $3^{rd}$ low refractive index layer | 0.46 | 0.42 to 0.52 | 0.23 | 0.2 to 0.29 | | | |
| $4^{th}$ high refractive index layer | 0.33 | 0.25 to 0.4 | | | | | |
| $4^{th}$ low refractive index layer | 0.25 | 0.2 to 0.3 | | | | | |
| substrate: $Lu_3Al_5O_{12}$ ($n_s = 2.14$) | | | | | | | |
| $1^{st}$ medium refractive index layer | 0.30 | 0.25 to 0.35 | 0.22 | 0.15 to 0.29 | | | |
| $1^{st}$ low refractive index layer | 0.12 | 0.06 to 0.17 | 0.42 | 0.37 to 0.47 | | | |
| $2^{nd}$ medium refractive index layer | 0.47 | 0.41 to 0.51 | 0.32 | 0.28 to 0.36 | | | |
| $2^{nd}$ low refractive index layer | 0.47 | 0.41 to 0.51 | 0.28 | 0.23 to 0.32 | | | |
| $3^{rd}$ medium refractive index layer | 0.28 | 0.24 to 0.32 | | | | | |
| $3^{rd}$ low refractive index layer | 0.27 | 0.22 to 0.30 | | | | | |
| substrate: CaO ($n_s = 2.7$) | | | | | | | |
| $1^{st}$ medium refractive index layer | 0.27 | 0.27 | 0.18 | 0.10 | | | |
| $1^{st}$ low refractive index layer | 0.20 | 0.77 | 0.13 | 0.15 | | | |
| $2^{nd}$ medium refractive index layer | 0.40 | 0.38 | | | | | |
| $2^{nd}$ low refractive index layer | 0.21 | 0.13 | | | | | |
| $3^{rd}$ medium refractive index layer | 0.35 | 0.42 | | | | | |
| $3^{rd}$ low refractive index layer | 0.23 | 0.21 | | | | | |
| substrate: CaO ($n_s = 2.7$) | | | | | | | |
| $1^{st}$ high refractive index layer | 0.25 | 0.25 | 0.79 | 0.79 | 0.16 | | |
| $1^{st}$ low refractive index layer | 0.31 | 0.21 | 0.26 | 0.20 | 0.17 | | |
| $2^{nd}$ high refractive index layer | 0.29 | 0.51 | 0.33 | 0.51 | | | |
| $2^{nd}$ low refractive index layer | 0.27 | 0.13 | 0.25 | 0.07 | | | |
| $3^{rd}$ high refractive index layer | | 0.37 | | 0.40 | | | |
| $3^{rd}$ low refractive index layer | | 0.24 | | 0.22 | | | |

The low refractive index layers are formed by optical materials preferably chosen from the group consisting of chiolithe ($Na_5Al_3F_{14}$)/cryolite ($Na_3AlF_6$), both with $n_L=1.35$, aluminium fluoride ($AlF_3$, $n_L=1.41$), magnesium fluoride ($MgF_2$, $n_L=1.44$), silicon oxide ($SiO_2$, $n_L=1.54$-1.58), calcium fluoride ($CaF_2$), lithium fluoride (LiF), sodium fluoride (NaF), and strontium fluoride ($SrF_2$).

The medium refractive index materials are preferably chosen from the group consisting of gadolinium fluoride ($GdF_3$, $n_L=1.65$), lanthanum fluoride ($LaF_3$, $n_L=1.7$), erbium fluoride ($ErF_3$), yttrium fluoride ($YF_3$), neodymium fluoride ($NdF_3$), dysprosium fluoride ($DyF_3$), holmium fluoride ($HoF_3$), scandium fluoride ($ScF_3$), zirconium fluoride ($ZrF_4$), ytterbium fluoride ($YbF_3$), hafnium fluoride ($HfF_4$), and thorium fluoride ($ThF_3$).

The material of the high refractive index layers is preferably chosen from the group consisting of sapphire ($Al_2O_3$, $n_L=1.8$-1.9), magnesium oxide (MgO, $n_L=2.0$), germanium oxide ($GeO_2$, $n_L=2.05$), lutetium aluminium garnet ($Lu_3Al_5O_{12}$, $n_L=2.14$), and calcium oxide (CaO, $n_L=2.7$). The use of sapphire or silicon oxide as materials is preferred as, depending on the production process used, it is possible to produce high-quality sapphire ($Al_2O_3$) as well as $SiO_2$ with sufficient quality with a refractive index between 1.8 and 1.9, resp. between 1.54 and 1.6. Moreover, these materials being oxides, they show good mechanical properties when combined with substrates also made of oxide materials.

It is understood that the above layer materials may be used as layer materials for all types of antireflection coatings described herein. Moreover, to release stress in the layer materials, it is preferred when one of the layers, in particular the first layer, i.e. the layer adjacent to the substrate, is made of an oxide material.

The invention is also realized in a projection objective in a microlithography projection exposure apparatus for imaging a structure onto a light-sensitive substrate, having at least one optical element as described above, which is preferably part of a projection objective and is located adjacent to the light-sensitive substrate. The optical element then has a first, exterior surface at the wafer side of the projection objective and a second, interior surface located inside the projection objective. In case that air or vacuum is the ambient medium present both inside and outside of the projection objective, it is possible to use the same antireflection coating for both the first and second surfaces.

The invention is further realized in a microlithography projection exposure apparatus with a projection objective as described above, wherein an immersion liquid is disposed between the light-sensitive substrate and the optical element located adjacent to the light-sensitive substrate. For the reasons set out above, the optical element being in contact with the immersion liquid should have a very high refractive index. Consequently, optical elements with antireflection coatings as described above are ideally suited for the interior surface of such an element being in contact with air or vacuum.

The exterior surface of such an element is in direct contact with the immersion liquid whose refractive index ideally matches the refractive index of its substrate. As immersion liquids with a high refractive index at or above 1.6 are difficult to handle, liquids with a smaller refractive index such as water ($n_A$=1.44) are used in many cases, such that there is a considerable difference between the refractive index of the substrate of the terminating element and the immersion liquid. In this case, it is advantageous to apply an antireflection coating also to the exterior surface of the optical element located adjacent the light-sensitive substrate being adapted to the refractive index of the immersion liquid, as is described in U.S. patent application Ser. No. 11/015,553 which is incorporated herein by reference in its entirety.

Further features and advantages of the invention can be extracted from the following description of embodiments of the invention, with reference to the figures of the drawing which show inventive details, and from the claims. The individual features can be realized individually or collectively in arbitrary combination in a variant of the invention.

DRAWING

The schematic drawing shows an embodiment of the invention which is explained in the following description.

Figure 2A:
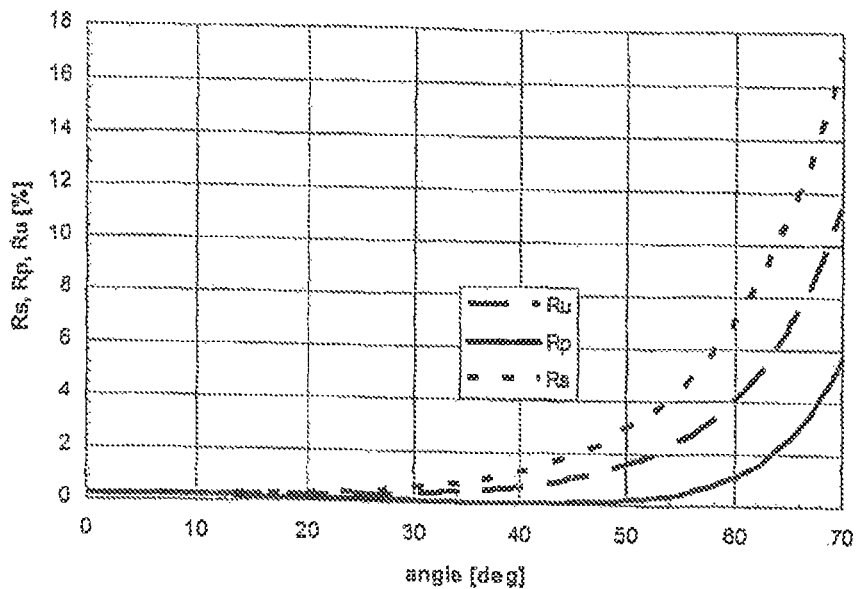
Figure 2B:
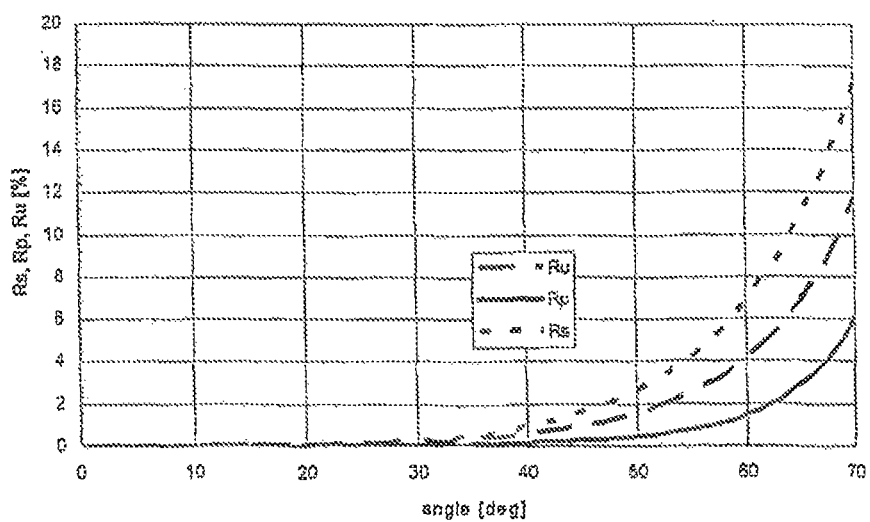
Figure 3:
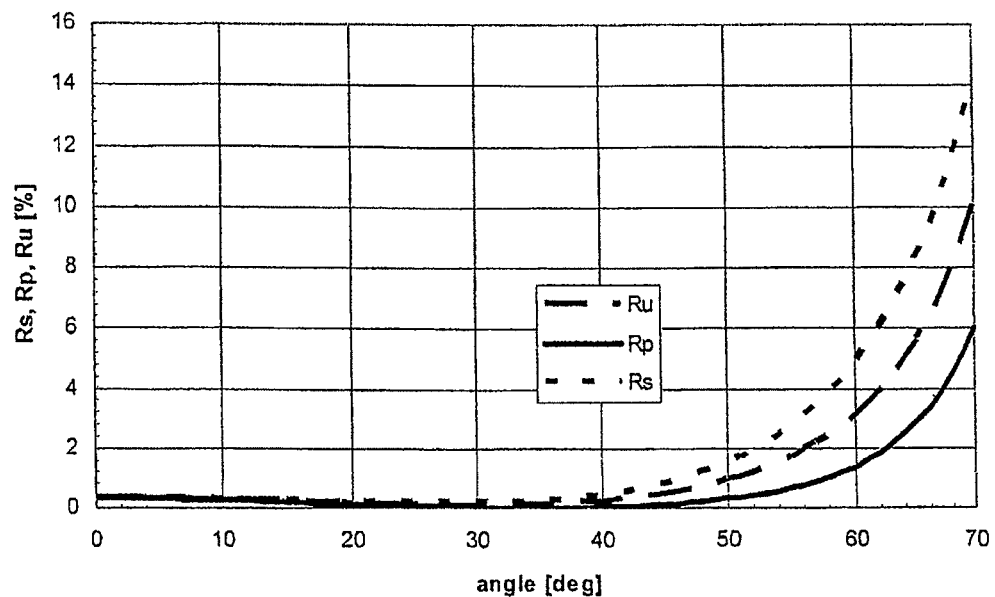
Figure 4:
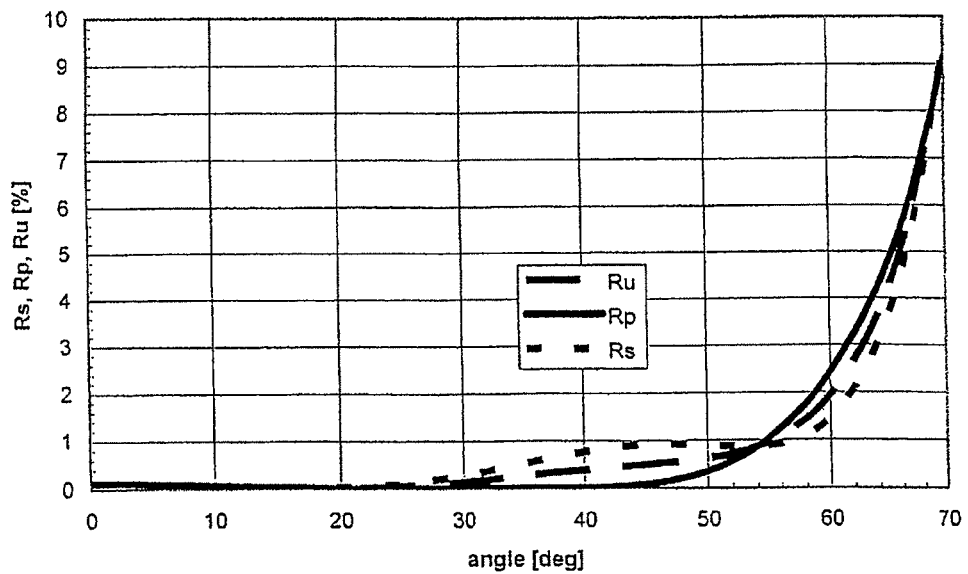

FIG. 1 shows an embodiment of a microlithography projection exposure apparatus according to the invention with an projection objective having an optical element with an antireflection coating located adjacent to the light-sensitive substrate, FIG. 2A, 2B each show a diagram of reflectance (in %) in dependence of the angle of incidence (in °) calculated for an optical element with a substrate of crystalline $SiO_2$ covered with a single layer of chiolithe (FIG. 2A), and with two layers made of chiolithe and lanthanum fluoride (FIG. 2B), FIG. 3 shows an analogous diagram for a substrate of magnesium oxide covered with three layers with decreasing refractive index being made of sapphire, lanthanum fluoride, and chiolithe, FIG. 4 shows an analogous diagram for a substrate of magnesium oxide covered with an arrangement of alternating medium and low refractive index layers made of lanthanum fluoride and magnesium fluoride, and FIG. 5A-D show embodiments of the optical element according to the invention with an antireflection coating with A) one, B) two, C) three, and D) six layers.

DETAILED DESCRIPTION

FIG. 1 shows a schematic representation of a microlithography projection exposure apparatus 1 in the form of a wafer stepper which is provided for manufacturing highly integrated semiconductor devices through immersion lithography. The projection exposure apparatus 1 comprises an excimer laser 2 as a light source with an operating wavelength of 193 nm, other operating wavelengths, for example 248 nm also being possible. A downstream illuminating system 3 produces in its exit plane 4a large, sharply delimited, very homogeneously illuminated image field.

Arranged downstream of the illuminating system 3 is a device 7 for holding and manipulating a mask 6 such that the latter lies in the object plane 4 of a projection objective 5 and can be moved in this plane for the purpose of scanning operation in a transverse direction 9. Following downstream of the plane 4, also designated as mask plane, is the projection objective 5, which projects an image of the mask on a reduced scale, for example the scale of 4:1 or 5:1 or 10:1, onto a wafer 10 covered by a photoresist layer. The wafer 10 serving as photosensitive substrate is arranged such that the flat substrate surface 11 with the photoresist layer substantially coincides with the image plane 12 of the projection objective 5. The wafer is held by a device 8 which comprises a scanner drive, in order to move the wafer synchronously with the mask 6 and parallel to the latter. The device 8 also comprises manipulators in order to move the wafer both in the z-direction parallel to the optical axis 13 of the projection objective 5, and in the x- and y-directions perpendicular to the said axis.

As an optical element 14 which is located adjacent to the wafer 10, the projection objective 5 has a hemispherical plano-convex lens whose flat exit surface is the last optical surface of the projection objective 5 and is arranged at a working distance above the substrate surface 11. Between the optical element 14 and the substrate surface 11 an immersion liquid 15, e.g. water, is disposed, the optical element 14 being in contact with the immersion liquid 15 with its flat exit surface on the wafer side. The larger numerical aperture produced in this manner permits imaging of smaller structures with the exposure apparatus 1 than is possible with use of air or vacuum as medium between the projection objective 5 and the substrate 10. For this purpose, the bulk of the optical element 14 is made of a substrate 17 with a refractive index at or above 1.6.

Suitable materials for the substrate 17 of the optical element 14 are given ordered by their refractive index in the following non-exhaustive table:

TABLE 3

| | |
|---|---|
| barium fluoride ($BaF_2$) | 1.57, |
| crystalline $SiO_2$ | 1.66, |
| potassium chloride (KCl) | 1.76, |
| sodium chloride (NaCl) | 1.83, |
| spinel ($MgAl_2O_4$) | 1.87, |
| sapphire ($Al_2O_3$) | 1.93, |
| magnesium oxide (MgO) | 2.0, |
| yttrium aluminium garnet ($Y_3Al_5O_{12}$) | 2.0, |
| germanium oxide ($GeO_2$) | 2.05, |
| lutetium aluminium garnet ($Lu_3Al_5O_{12}$) | 2.14, |
| calcium oxide (CaO) | 2.70 |

On the curved surface of the optical element 14 adjacent to the medium present inside of the projection objective 5, being either air or vacuum both with $n_A$=1.0, an antireflection coating 16 is formed. The antireflection coating 16 is selected from one of four different types of coatings being described in detail below and shown in FIG. 5A-5D (the curved surface of the substrate 17 being represented as flat for the sake of simplicity), each consisting of one or more layers made of materials having an optical thickness and a refractive index being selected in dependence of the refractive index of the substrate material 17 of the optical element 14. Of course, other optical elements with a substrate having a high refractive index above 1.6 can be covered with such antireflection coatings as well in order to advantageously suppress reflections.

To the flat exit surface of the optical element 14, an antireflection coating may be applied according to one of the types described below, yet adapted to the refractive index of the immersion liquid constituting the ambient medium. This antireflection coating may be covered by a further layer made of a material which is inert with respect to the immersion liquid 15. This further protective layer prevents damage of the antireflection coating and the underlying substrate due to a chemical attack by the immersion liquid. If the immersion liquid is water, the protective layer cab be made e.g. of $SiO_2$ or Teflon.

Figure 5A:
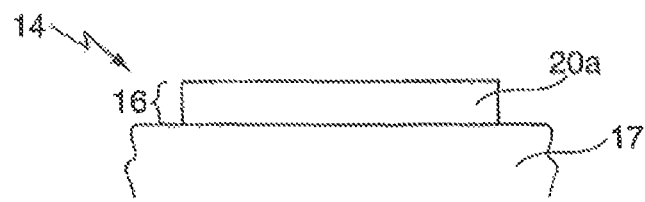

A first type of antireflection coating 16 for the internal surface of the substrate 17 consists of only a single layer 20a, as shown in FIG. 5A. This type is preferred when it is sufficient to reduce reflectance for small to medium angles of incidence only. In this case, the refractive index of the layer $n_L$ should be approximately equal to the square root of the refractive index $n_s$ of the substrate material 17 of the optical element 14 and the optical thickness of the layer should be about $\lambda/4$.

In the diagram of FIG. 2A, the reflectance of an optical element made of a substrate of crystalline $SiO_2$ (with refractive index $n_s=1.66$) covered with such a single-layer antireflection coating consisting of chiolithe ($n_L=1.35$) is shown in dependence of the angle of incidence. The three plots represented in FIG. 2A show the reflectance $R_S$ of the s-polarized radiation component, the reflectance $R_P$ of the p-polarized radiation component, and the average reflectance $R_U$ of the both polarization components. Similar results can be obtained when a substrate of lutetium aluminium garnet $Lu_3Al_5O_{12}$ (with refractive index $n_S=2.14$) is covered with a single layer of magnesium fluoride $MgF_2$ (with refractive index $n_L=1.44$).

For crystalline $SiO_2$, however, the ideal layer material according to the formula $n_L=\sqrt{n_A n_S}$ given above has a refractive index $n_L=1.29$. As such a material with a sufficient durability when exposed to intense laser radiation is not available, it is convenient to use a second type of antireflection coating consisting of two layers with refractive indices being approximately related by $n_{L1}=n_{L2}\sqrt{n_S}$, both layers having an optical thickness of about $\lambda/4$.

Figure 5B:
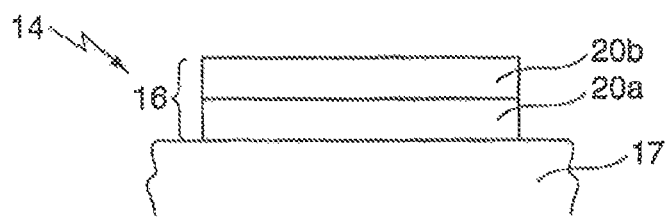

FIG. 2B shows the reflectance in dependence of the incident angle for such a two-layer antireflection coating shown in FIG. 5B with the same substrate as FIG. 2A (crystalline $SiO_2$), the material of the first layer 20a being lanthanum fluoride ($LaF_3$) with refractive index $n_{L1}=1.7$, the material of a second layer 20b being cryolite ($Na_3AlF_6$) with refractive index $n_{L2}=1.35$. The layer with the higher refractive index ($LaF_3$) is located adjacent to the substrate, whereas the layer with the smaller refractive index ($Na_5Al_3F_{14}$) is located adjacent to the ambient medium.

When comparing the reflectance plots of FIG. 2A and FIG. 2B, it is evident that the use of two layers instead of a single layer yields an improved suppression of reflectance for small to medium angles of incidence ranging from 0° to 45° and that the separation of polarization components for larger angles of incidence is reduced. Although showing in the present example only to a small extent, the two-layer type of antireflection coating may also be advantageously used to suppress reflectance for higher angles of incidence above 60°

Antireflection coatings with two layers are also applicable for substrate materials with a high refractive index (1.8 and above). For such materials, the above formula for the refractive indices can hardly be satisfied, as e.g. for $MgF_2$ with $n_{L2}=1.35$ as a second layer material, the refractive index of the first layer material would be ideally $n_{L1}=2.1$. Therefore, the optical thickness of the layers is no longer chosen to be equal to $\lambda/4$. With layers of different optical thickness, the reflectance for large incident angles and polarization splitting can be improved. Moreover, a two-layer antireflection coating may be chosen for high-index substrate materials not only for optical, but also for mechanical reasons, e.g. for improving adhesion of layers or layer hardness, or as a diffusion barrier. For lutetium aluminium garnet as a substrate material, an antireflection coating with a first layer 20a having a high refractive index and an optical thickness between 0.04 and 0.15 and a second layer 20b having a low refractive index and an optical thickness between 0.20 and 0.3 is preferred, where the first layer 20a is preferably made of sapphire ($Al_2O_3$) and the second layer is preferably made of magnesium fluoride $MgF_2$. Optical thickness is defined herein as full wave optical thickness, i.e. layer thickness in units of wavelength.

A third type of antireflection coating which can be applied to the optical element 14 consists of at least three layers with refractive indices $n_{Li}$, the refractive indices $n_{Li}$ of the layers decreasing with increasing distance from the substrate. This type of antireflection coating approximates an "ideal antireflection coating" with a refractive index decreasing continuously from the substrate to the ambient medium.

Figure 5C:
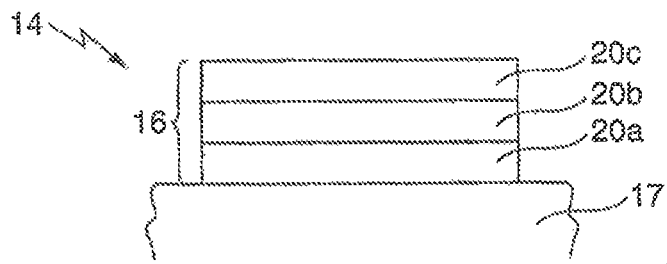
Figure 5D:
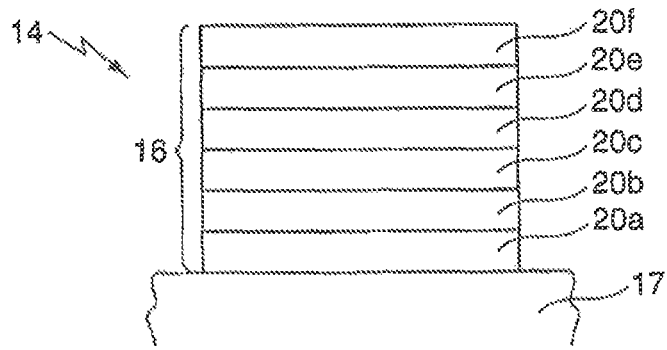

An example of the reflectance of such an antireflection coating is shown in FIG. 3 for a substrate of magnesium oxide (MgO, $n_s=2.0$) with a coating consisting of three layers 20a to 20c shown in FIG. 5C, the material of the first layer 20a adjacent to the substrate being sapphire ($Al_2O_3$, $n_{L1}=1.9$, $d_{L1}=0.3$), the material of a second layer superimposed over the first layer being lanthanum fluoride ($LaF_3$, $n_{L2}=1.7$, $d_{L2}=0.45$), and the material of a third layer superimposed over the second layer being chiolithe ($Na_5Al_3F_{14}$, $n_{L3}=1.35$, $d_{L3}=0.3$). The overall optical thickness of such a type of coating should be in an range between 0.6 to 3 in units of wavelength, which is the case for the present example with an overall optical thickness of 1.05. This type of antireflection, coating is preferably used for reducing reflectance at high angles of incidence.

A fourth type of antireflection coating consists of high or medium refractive index layers alternating with low refractive index layers, wherein the optical thicknesses of all high or medium and low refractive index layers are chosen such that reflection of radiation, in particular for high angles of incidence, is minimized. The layer thicknesses are preferably optimized by numerical calculations and experiments. Suitable designs of antireflection coatings for the substrates of table 3 are shown in table 2, the layer thicknesses of all layers being different from each other. In table 2, the high refractive index layers have a refractive index larger than 1.8, the medium refractive index layers have a refractive index between 1.58 and 1.8, and the low refractive index layers have a refractive index smaller than 1.58, the number of layers varying between two and six.

The optical performance of this type of antireflection coating especially with four or more layers is superior to that of the other coating designs, particularly for high angles of incidence. For a substrate of magnesium oxide, the reflectance of a design consisting of six layers 20a to 20f shown in FIG. 5D with layer thicknesses reproduced in the first column of table 2 is shown in FIG. 4. As a layer material for the medium and low refractive index layers, lanthanum fluoride with a refractive index of 1.7 and magnesium fluoride with a refractive index of 1.44 have been used, respectively. As can be seen from FIG. 4, the reflectance of radiation with high angles of incidence is strongly suppressed in the present example and especially the separation of the two polarization components is drastically reduced compared to the design shown in FIG. 3 for the same substrate material (MgO). Similar results can be achieved with a substrate of lutetium aluminium garnet $Lu_3Al_5O_{12}$ being covered with antireflection coatings with four to six layers, each having a range of optical thicknesses as described in table 2.

It is understood that the use of optical elements provided with the antireflection coatings as described above is not limited to microlithography exposure apparatuses, but any transparent optical element with a substrate having a high refractive index above 1.6 in the UV wavelength range below 250 nm may be covered with such an antireflection coating in order to efficiently suppress reflections. Also, if a first part of the surface of the optical element is in contact with a first ambient medium and a second part of the surface with another, an antireflection coating of one of the types described above being adapted to the refractive index of the corresponding ambient medium may be applied in each case.

The invention claimed is:

1. Optical element transparent for radiation with a wavelength λ in the ultraviolet wavelength range below 250 nm, comprising:
a substrate with a refractive index $n_s$ no larger than 1.8, and
an antireflection coating formed on at least part of the surface of the substrate between the substrate and an ambient medium with a refractive index $n_A$,
wherein the antireflection coating comprises low refractive index layers alternating with medium refractive index layers, such that a first low refractive index layer is provided adjacent to the substrate and at least one further low refractive index layer alternates with at least one medium refractive index layer, and such that the first low refractive index layer lies closer to the substrate than do any of the medium refractive index layers,
wherein all the medium refractive index layers have optical thicknesses that differ from each other, and all the low refractive index layers have optical thicknesses that differ from each other,
wherein the optical thickness of the first low refractive index layer is less than 0.45λ, where λ is 193 nm,
wherein the optical thickness of a second low refractive index layer is between 0.26λ and 0.34λ, where λ is 193 nm, and where the second low refractive index layer is arranged on the first low refractive index layer with a medium refractive index layer arranged between the first low refractive index layer and the second low refractive index layer,
wherein the optical thicknesses of all the medium and low refractive index layers are such that reflection of the radiation is minimized, and
wherein the substrate comprises a material selected from the group consisting of: barium fluoride ($BaF_2$), silicon oxide ($SiO_2$), and potassium chloride (KCl).

2. Optical element according to claim 1, wherein the medium refractive index layers have a refractive index between 1.58 and 1.8, and the low refractive index layers have a refractive index smaller than 1.58.

3. Optical element according to claim 1, wherein a material of the low refractive index layers is selected from the group consisting of: chiolithe ($Na_5Al_3F_{14}$), cryolite ($Na_3AlF_6$), aluminium fluoride ($AlF_3$), magnesium fluoride ($MgF_2$), silicon oxide ($SiO_2$), calcium fluoride ($CaF_2$), lithium fluoride (LiF), sodium fluoride (NaF), and strontium fluoride ($SrF_2$).

4. Optical element according to claim 1, wherein a material of the medium refractive index layers is selected from the group consisting of: gadolinium fluoride ($GdF_3$), lanthanum fluoride ($LaF_3$), erbium fluoride ($ErF_3$), yttrium fluoride ($YF_3$), neodymium fluoride ($NdF_3$), dysprosium fluoride ($DyF_3$), holmium fluoride ($HoF_3$), scandium fluoride ($ScF_3$), zirconium fluoride ($ZrF_4$), ytterbium fluoride ($YbF_3$), hafnium fluoride ($HfF_4$), and thorium fluoride ($ThF_3$).

5. Optical element according to claim 1, wherein the surface is a hemispherical surface.

6. Projection objective for imaging a structure onto a light-sensitive substrate, having at least one optical element according to claim 1.

7. Projection objective according to claim 6, wherein the optical element is located adjacent to the light-sensitive substrate.

8. Microlithography projection exposure apparatus with a projection objective according to claim 7, wherein an immersion liquid is disposed between the light-sensitive substrate and the optical element which is located adjacent to the light-sensitive substrate.

9. Microlithography projection exposure apparatus with a projection objective according to claim 6, wherein an immersion liquid is disposed between the light-sensitive substrate and the optical element which is located adjacent to the light-sensitive substrate.

10. Optical element transparent for radiation with a wavelength λ in the ultraviolet wavelength range below 250 nm, comprising:
a plano-convex substrate with a refractive index $n_s$ no larger than 1.8 and with a convex radiation-entrance surface, and
an antireflection coating formed on at least part of the convex surface of the substrate between the substrate and an ambient medium with a refractive index $n_A$,
wherein the antireflection coating comprises low refractive index layers alternating with medium refractive index layers, such that a first low refractive index layer is provided directly adjacent to the substrate and at least one further low refractive index layer alternates with at least one medium refractive index layer, and such that the first low refractive index layer lies closer to the substrate than do any of the medium refractive index layers,
wherein all the medium refractive index layers have optical thicknesses that differ from each other, and all the low refractive index layers have optical thicknesses that differ from each other,
wherein the optical thickness of the first low refractive index layer is less than 0.45λ, where λ is 193 nm,
wherein the optical thickness of a second low refractive index layer is between 0.26λ and 0.34λ, where λ is 193 nm, and where the second low refractive index layer is arranged on the first low refractive index layer with a medium refractive index layer arranged between the first low refractive index layer and the second low refractive index layer,
wherein the optical thicknesses of all the medium and low refractive index layers are such that reflection of the radiation is minimized, and
wherein the substrate comprises a material selected from the group consisting of: barium fluoride ($BaF_2$), silicon oxide ($SiO_2$), and potassium chloride (KCl).

11. The optical element according to claim 10, wherein the medium refractive index layers have a refractive index between 1.58 and 1.8, and the low refractive index layers have a refractive index smaller than 1.58.

12. The optical element according to claim 10, wherein a material of the low refractive index layers is selected from the group consisting of: chiolithe ($Na_5Al_3F_{14}$), cryolite ($Na_3AlF_6$), aluminium fluoride ($AlF_3$), magnesium fluoride ($MgF_2$), silicon oxide ($SiO_2$), calcium fluoride ($CaF_2$), lithium fluoride (LiF), sodium fluoride (NaF), and strontium fluoride ($SrF_2$).

13. The optical element according to claim 10, wherein a material of the medium refractive index layers is selected from the group consisting of: gadolinium fluoride ($GdF_3$), lanthanum fluoride ($LaF_3$), erbium fluoride ($ErF_3$), yttrium fluoride ($YF_3$), neodymium fluoride ($NdF_3$), dysprosium fluoride ($DyF_3$), holmium fluoride ($HoF_3$), scandium fluoride ($ScF_3$), zirconium fluoride ($ZrF_4$), ytterbium fluoride ($YbF_3$), hafnium fluoride ($HfF_4$), and thorium fluoride ($ThF_3$).

* * * * *